United States Patent
Christensen et al.

[11] Patent Number: 6,121,659
[45] Date of Patent: Sep. 19, 2000

[54] BURIED PATTERNED CONDUCTOR PLANES FOR SEMICONDUCTOR-ON-INSULATOR INTEGRATED CIRCUIT

[75] Inventors: Todd Alan Christensen, Rochester; John Edward Sheets, II, Zumbrota, both of Minn.

[73] Assignee: International Business Machines Corporation, Armonk, N.Y.

[21] Appl. No.: 09/049,488

[22] Filed: Mar. 27, 1998

[51] Int. Cl.[7] ............................. H01L 21/01; H01L 29/06
[52] U.S. Cl. .................... 257/347; 257/351; 257/353; 257/621; 257/622
[58] Field of Search ............................ 257/349, 347, 257/350, 355, 357, 351, 353, 621, 624, 758; 438/149, 151, 311, 618, 622

[56] References Cited

U.S. PATENT DOCUMENTS

| | | | |
|---|---|---|---|
| 4,478,655 | 10/1984 | Nagakubo et al. | 148/175 |
| 4,889,832 | 12/1989 | Chatterjee | 437/203 |
| 4,939,568 | 7/1990 | Kato et al. | 357/75 |
| 4,966,864 | 10/1990 | Pfiester | 437/191 |
| 4,982,266 | 1/1991 | Chatterjee | 357/71 |
| 5,145,802 | 9/1992 | Tyson et al. | 437/63 |
| 5,286,670 | 2/1994 | Kang et al. | 437/61 |
| 5,294,821 | 3/1994 | Iwamatsu | 257/351 |
| 5,300,454 | 4/1994 | Taft et al. | 437/154 |
| 5,479,048 | 12/1995 | Yallup et al. | 257/621 |
| 5,488,012 | 1/1996 | McCarthy | 437/62 |
| 5,654,573 | 8/1997 | Oashi et al. | 257/349 |
| 5,889,306 | 3/1999 | Christensen et al. | 257/350 |
| 5,923,067 | 7/1999 | Voldman | 257/349 |

FOREIGN PATENT DOCUMENTS

| | | | |
|---|---|---|---|
| 62-15852 | 1/1987 | Japan | H01L 27/08 |
| 2-271657 | 11/1990 | Japan | H01L 27/00 |
| 5-167007 | 7/1993 | Japan | H01L 27/00 |
| 07283414A | 10/1995 | Japan | H01L 29/786 |
| 10041511A | 2/1998 | Japan | H01L 29/786 |
| 63-43375 | 2/1998 | Japan | H01L 29/78 |
| 11135799A | 5/1999 | Japan | H01L 29/786 |

*Primary Examiner*—Wael Fahmy
*Assistant Examiner*—William David Coleman
*Attorney, Agent, or Firm*—Karuna Ojanen; Matthew J. Bussan; Roy W. Truelson

[57] ABSTRACT

A semiconductor-on-insulator integrated circuit with buried patterned layers as electrical conductors for discrete device functions, thermal conductors, and/or decoupling capacitors.

17 Claims, 8 Drawing Sheets

FIGURE I

BURIED PATTERNED CONDUCTOR PLANES FOR SEMICONDUCTOR-ON-INSULATOR INTEGRATED CIRCUIT

FIELD OF THE INVENTION

The invention relates generally to semiconductor-on-insulator integrated circuits and devices. More specifically, the invention relates to semiconductor-on-insulator devices which use the buried patterned layers as electrical conductors for discrete device functions, thermal conductors, and/or decoupling capacitors.

BACKGROUND OF THE INVENTION

Semiconductor processing has moved towards the production of smaller and smaller devices having greater computing capability. The reduction in the size of electronic devices and the increase in density of transistors in a given unit area results in increased power required and dissipated. Enhanced semiconductor fabrication techniques, such as silicon-on-insulator (SOI) processing, increase metal wiring requirements because of the increase transistor density and power decoupling requirements.

Specific applications, such as arrays, are impacted by the amount of wiring needed to fully enable the application. Wiring in semiconductor devices is generally configured in multiple planes, especially when multiple devices are configured in a dense pattern. Metal wiring in a given plane of the device reduces the area available in that plane for other electronic functions and severely constrains device performance. These problems undermine the overall objective to fabricate smaller, more densely packed devices having superior performance.

Prior publications which are exemplary of SOI process technology include Chatterjee, U.S. Pat. Nos. 4,889,832 and 4,982,266. Chatterjee discloses an integrated circuit structure in which metal layers both above and below an active circuit are interconnected. Chatterjee proposes an improved method of forming such an integrated circuit structure by utilizing an etch stop layer formed on a silicon surface.

Kato et al., U.S. Pat. No. 4,939,568 teaches a stacked semiconductor integrated circuit structure and method of forming the same, in which conducting posts extend between device surfaces. This is intended to allow large scale integrated circuit manufacturing.

Pfiester, U.S. Pat. No. 4,966,864 discloses a semiconductor device and method in which a silicon substrate is formed with a doped region, with the doped region being connected to an electrode by a conducting bridge. This invention is intended to overcome pitting or etching problems encountered in previous fabrication techniques.

McCarthy, U.S. Pat. No. 5,488,012, discloses SOI wafers and improved methods for forming buried regions therein. The invention is particularly useful in silicon-on-glass substrates.

Iwamatsu, U.S. Pat. No. 5,294,821, discloses SOI technology which is intended to provide more uniform electrical characteristics including a reduction in breakdown voltage. Iwamatsu proposes a device having active layers diffused into the substrate to stabilize the electrical characteristics of the device.

Tyson et al., U.S. Pat. No. 5,145,802, discloses a SOI circuit which includes a set of buried body ties that provide a local ohmic contact to the transistor bodies disposed on an insulating layer. This is intended to provide a path for holes generated by impact ionization and also act as a potential shield between the substrate and the transistor sources.

Kang et al., U.S. Pat. No. 5,286,670, teaches a method of manufacturing a semiconductor device having buried elements with electrical characteristics. Kang uses a complex system of buried electrical elements in the substrate, bonding the substrate to the silicon that is to become the SOI region. One exemplary use for the buried elements is as capacitors in memory cells. But, in fact, Kang et al. add to the complexity of device fabrication without resolving concerns of wiring density.

Conventional SOI technology reduces a large portion of the drain capacitance and, to a lesser extent, the gate capacitance because the insulator layer does not have many available free carriers. In operation, however, carriers flow through the transistor and resistive heating occurs in the gate. Undesirable floating body effects including transistor hysteresis and threshold shifts may occur if the transistor body is allowed to electrically float. The electrical bias placed on the device by the remaining carriers causes a narrowing in the depth of the transistor body channel which affects performance.

Decoupling capacitance, moreover, is significantly reduced on traditional semiconductor-on-insulator structures. The structure experiences a phenomena referred to as power-supply collapse so that the voltage swing level between a logical one and a logical zero is reduced, e.g., a logical zero may no longer be at ground voltage.

Semiconductor on insulator devices are very desirable given the desirable electrical isolation obtained from the SOI structure. However, this structure creates undesirable thermal insulation which, in turn, causes troublesome joule heating in the devices. An alternative embodiment of the invention provides a low-resistance thermal path from the transistor diffusion to a plane in the bulk substrate, providing a thermal sink which reduces thermal effects.

SUMMARY OF THE INVENTION

In accordance with one aspect of the invention there is provided semiconductor circuit comprising a conductive substrate having a first volume doped with first dopant and a second volume doped with a second dopant, an insulator layer and an active layer doped with impurities to form a first device and a second device. Additionally, the semiconductor circuit comprises a first conductor electrically connecting the first device and the first volume and a second conductor electrically connecting the second device and the second volume.

Preferably, the first and second devices are field effect transistors, but can be other active devices such as other transistors, inductors, or capacitors. The conductors are preferably tungsten studs which can either be adjacent to or in physical contact with the doped volumes. The invention is applicable to any circuit structure where the substrate is separated from active devices by an electrically insulative layer. Semiconductor-on-insulator circuit structures can be made from any number of chemistries of Group III, IV, and V and mixtures thereof.

Thus, in accordance with another aspect of the invention, there is provided a circuit comprising a SOI semiconductor device having a conductive silicon substrate with a first volume doped with an n+ type dopant and a second volume doped with a p+ type dopant, an insulator layer of silicon dioxide, a silicon layer doped with impurities forming a first transistor and a second transistor having an isolation volume between the first transistor and the second transistor. A first conductive stud electrically connects the first transistor to the first volume. A second conductive stud electrically connects the second transistor to the second volume.

In accordance with a further aspect of the invention, there is provided an integrated semiconductor circuit comprising an active layer separated from a buried layer by an insulator layer, the buried layer comprising an equipotential net of patterned doped volumes and the circuit further comprising a contact and an electrical conductor connecting the contact and the equipotential net.

The invention is also a method of manufacturing a semiconductor device, comprising the steps of first defining at least one buried volume of a second conductivity in a semiconductor substrate of a first conductivity. The semiconductor substrate is a layered arrangement of a first insulator layer adjacent the semiconductor substrate, an active semiconductor layer adjacent the first insulator layer, and a second insulator layer adjacent the active semiconductor layer. A third insulator layer, adjacent the second insulator layer, and a mask on top of the third insulator layer are removed. A photoresist is developed and removed to expose a plurality of isolation volumes in the active semiconductor layer and the exposed isolation volumes are etched down to the first insulator layer. The isolation volumes are filled with a fourth insulator. At least one active electronic device having a diffusion region is then formed between the isolation volumes in the active semiconductor layer. A first dielectric is deposited on the surface of the semiconductor device. At least one stud opening for a conductive stud is created so that the stud extends from the surface of the first dielectric through the diffusion region of the active semiconductor layer and through all layers of the semiconductor device to either the substrate or to the buried volumes. A conductive material is introduced into the stud opening to form the stud. Electrical contacts are patterned onto the stud.

A fourth insulator layer may be added over the surface of the semiconductor device including the surface of the studs.

With the invention, ground wires can be eliminated by connecting all electrically grounded transistor devices to the bulk silicon substrate using a buried conductive stud. The conductive stud generally extends from the active silicon layer through the insulator layer to electrically contact the thick, low resistivity bulk silicon substrate below. The invention provides thermal conductance to reduce heating effects which reduce the switching speeds of active devices, such as transistors. The invention also provides decoupling capacitance between buried layers having different dopants and, hence, different voltage levels.

DETAILED DESCRIPTION OF THE PREFERRED EMBODIMENT

The invention is applicable to any number of semiconductor-on-insulator device types conducive to semiconductor processing. In accordance with one preferred aspect of the invention, the invention may be used with SOI processing technology in the fabrication of field effect transistors (FETs). The invention may be used for any number of devices which have one or more active electronic components defined in the active semiconductor layer. As shown in FIGS. 1–6, the exemplary embodiment illustrates two transistors formed on silicon.

Figure 1:
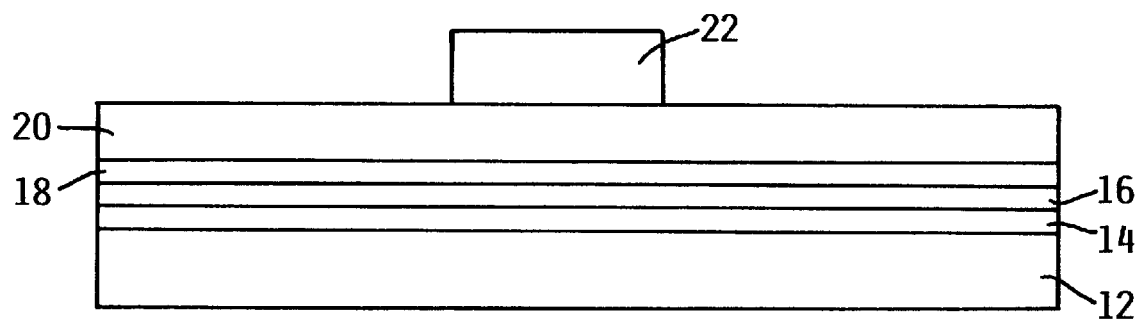
FIGS. 1 through 6 are cross-sectional views of the stages of the formation of a depicted silicon-on-insulator device in accordance with one embodiment of the invention.

Starting with FIG. 1, as a preliminary step, a semiconductor substrate 12, preferably silicon, is used. Other compatible semiconductors as is known in the art from, e.g., Group III and V, and Group IV, may also be used for the substrate and the various layers of the invention. Generally, before any fabrication begins, the substrate 12 is doped with either an n+ type or p+ type dopant. Once doping is completed, the substrate 12 preferably has a resistance of less than about ten ohms per square unit, preferably less than about two ohms per square unit, with a wafer resistivity of about 0.01 to 0.1 (ohm)-(cm). After ion implantation of the silicon substrate to dope the substrate, the resultant ion concentration is generally about $1 \times 10^{16}$ to $3 \times 10^{21}$ atoms per cubic centimeter, preferably about $5 \times 10^{19}$ to $1 \times 10^{21}$ atoms per cubic centimeter.

Typically, however, the substrate 12 is a silicon wafer having an insulator layer 14. For example, the starting SOI blanks have an insulator layer thickness of about 0.2 to 0.7 $\mu$m, preferably about 0.5 $\mu$m, on an active silicon layer 16 of thickness of about 0.1 to 4 $\mu$m and preferably about 0.2 $\mu$m. Preferably, the insulator layer comprises a silicon oxide such as silicon dioxide ($SiO_2$). $SiO_2$ is characterized by pronounced dielectric capabilities. The relative permittivity of $SiO_2$ is about 3.9. Other insulators which may be considered include nitrides, polymers, and intrinsic silicon. The balance of substrate 12 has a thickness of about 625 $\mu$m.

In further preparing the substrate 12 for implant patterning, an additional oxide layer 18 of thickness of about 100 to 300 Å may be deposited onto active silicon layer 16. A final silicon nitride layer 20 having a thickness of about 300 to 600 Å is then generally deposited onto oxide layer 18. An oxide mask 22 may then be formed and patterned on silicon nitride layer 20. This completes the sacrificial structure used to assist in defining the implant volumes 24A and 24B as shown in FIG. 2.

Figure 2:
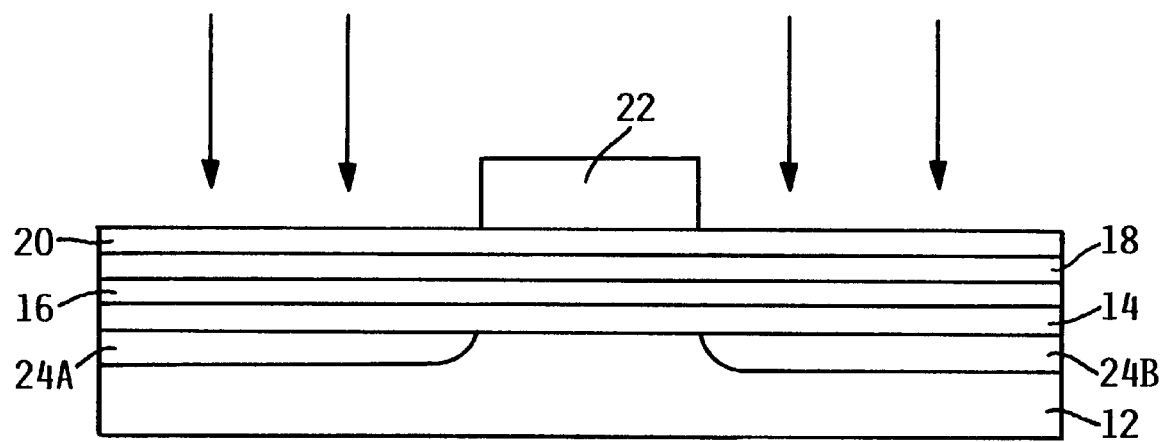

To define the doped volumes 24A and 24B, the layered structure is implanted with a dopant opposite to the dopant type of substrate 12 at high energies, generally 200 KeV to 800 KeV and, preferably about 600 KeV, as shown in FIG. 2. The more energy used to form implant volumes 24A and 24B, the less likely it will be that dopant is retained in the mask layers above substrate 12.

The substrate 12 is generally conductive and may be used as ground and power planes such as described in U.S. patent application Ser. No. 08/782,462, assigned to assignee herein and incorporated by reference. In the context of the invention, use of the substrate 12 as a power source means that the substrate 12 provides a constant voltage bias from an external voltage source. Generally, the substrate may be made conductive by either using donor dopants or acceptor dopants. Donor dopants donate electrons and are generally found in Group VA. If the substrate is to be n+ type, the donor dopant may preferably comprise, for example, phosphorous, antimony, or arsenic. Acceptor dopants which contribute holes are generally those elements in Group IIIA. Thus, if the substrate is to be p+ type, the acceptor dopant preferably comprises boron or any other atomic species capable of creating this ionic character in the substrate 12. Doped volumes 24A and 24B may then be formed using the sacrificial implant structure and a p+ type dopant. Generally the p+ type dopant results in a concentration of $1 \times 10^9$ to $1 \times 10^{20}$ per cubic centimeter, preferably $1 \times 10^{20}$ per cubic centimeter and a resistance in volumes 24A and 24B of ten to twenty ohms per square unit.

Figure 3:
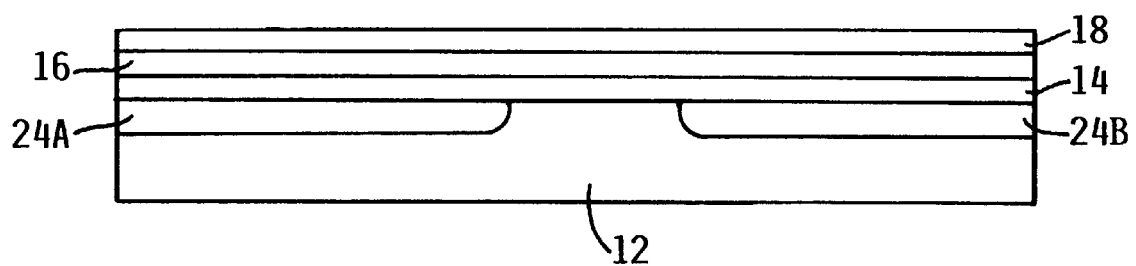

After implant volumes 24A and 24B are formed, the oxide mask 22 and silicon nitride layer 20 are removed as shown in FIG. 3 in preparation for the patterning of the active silicon layer 16 and the formation of the active devices in active layer 16.

Figure 4:
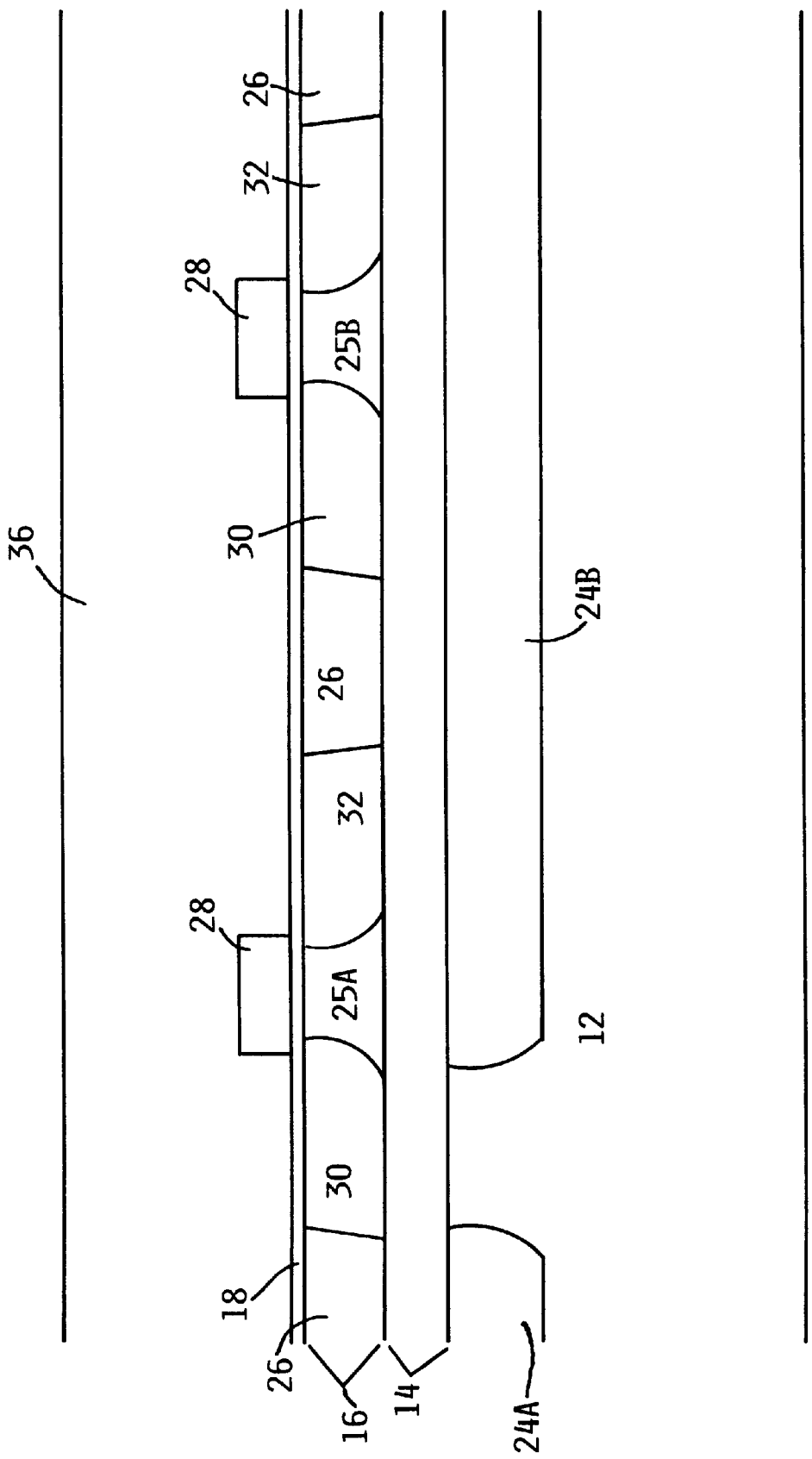

To form the isolation volumes 26 between each active device 25A, 25B in the active shown in FIG. 4, a photoresist is developed and removed over the volume which is to be the isolation volume 26. The exposed active silicon in the isolation volume is then removed by etching. The active silicon is etched down to the silicon dioxide insulator layer 14 using, for example, carbon tetrachloride which provides high selectivity. The opening is then fabricated into the isolation volume 26 by refilling with an insulative material such as silicon dioxide using bulk processing methods such as chemical vapor deposition which provides conformal deposition of the material.

This is the point where the active devices 25A, 25B such as capacitors, diodes, inductors, resistors, and transistors are fabricated into the active layer 16. In the preferred embodiment, the devices 25A, 25B are field effect transistors. To form the gate 28 for each transistor, the photolithographic mask used to form isolation volumes 26 is removed and an oxide such as silicon dioxide 18 is reformed over the isolation volumes 26 and on the active silicon 16. One method of forming the oxide is by steam processing at 900 degrees C. to 1100 degrees C. for about twenty minutes. Generally, the thickness of the silicon dioxide ranges from about 20 Å to 100 Å, with a typical thickness being about 40 Å. To complete the transistor gates 28, a polysilicon layer is then deposited over the silicon dioxide 18 to a thickness of about 2000 Å. This deposition may be completed by vapor deposition with a silane source gas at about 700 degrees C. A positive photoresist may then be deposited and patterned to form the gate conductors 28 from the polysilicon layer. An implant mask (not shown) is then formed. The implant mask allows for the implanting of either n+ type or p+ type ions to form source 30 and drain 32 regions in the transistors.

In forming the source 30 and drain 32 for the transistors, the ions may generally be diffused in the intended region to the interface between the active silicon 16 and the silicon dioxide insulator layer 14. Alternatively, the formed source and drain ion diffusion volumes may penetrate only partially into the active silicon layer 16. In operation this partial diffusion provides very definite characteristics in conjunction with the transistors. When the diffusion areas 30, 32 of ions only partially penetrate the active silicon layer 16, the active device extends into the area which will later be occupied by the conductive studs 34 and 35 shown in FIGS. 5 and 6. Thus, in the preferred embodiment, the conductive studs 34, 35 penetrate either the source 30 or drain 32, preferably the source 30 of a transistor referred to here as 25A or 25B. In this embodiment, the conductive stud also provides a thermal drain for any resistive heating which may take place in the transistor. The conductive stud also provides a drain for any free carriers, thereby reducing transistor floating body effects.

Figure 5:
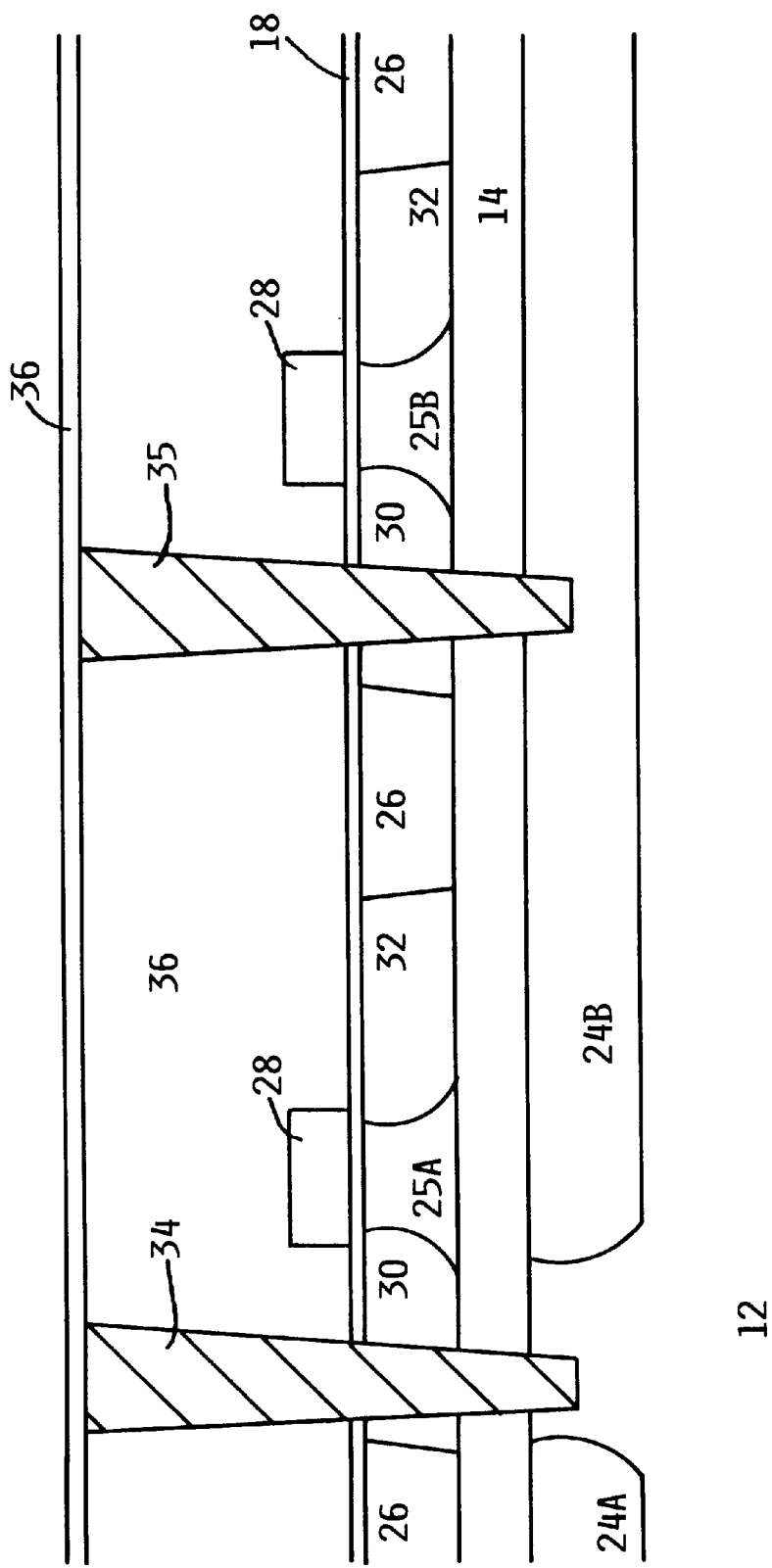

Once the transistor device is formed, a planarized dielectric 36 may be deposited on the surface of devices 25A and 25B, as shown in FIGS. 4 and 5. The dielectric 36 functions to stabilize the device, electrically isolating the device and stabilizing the device for further processing. The device is then masked to form openings for the conductive studs 34, 35 as in FIG. 5. The studs 34, 35 function as a connection between the substrate 12 and the devices 25A and 25B formed in the active silicon layer 16. Generally studs 34, 35, 39, and 40, shown in FIG. 6, may comprise any number of conductive materials such as tungsten, aluminum, copper, or a conductive doped silicon. The opening for the stud may be formed with a high pressure sputter etch in argon gas using a sequence of selective or non-selective etchants. Preferably, the etchants used are non-selective and anisotropic. The openings for the conductive studs 34, 35 extend into the substrate 12 to a level necessary to provide electrical connection between the substrate 12 or the implanted volumes 24A, 24B to the active devices 25A and 25B, typically about one $\mu$m. Stud 34 connects source 30 of transistor 25A to $V_{dd}$ through the substrate 12. Stud 35 connects source 30 of transistor 25B to ground in region 24B of FIGS. 5 and 6. Additional layers of dielectric 36 may then be deposited on the device.

Once the opening for the conductive stud 34 is formed, the opening is coated with a material which promotes adhesion to the surrounding oxide such as titanium or titanium nitride. This material adheres to the walls of the opening. A conductive material such as tungsten is then introduced into the opening and may be conformally placed in the opening by chemical vapor deposition or sputtering. Oxide layer 50 is formed over the surface of the devices including studs 34 and 35.

Figure 6:
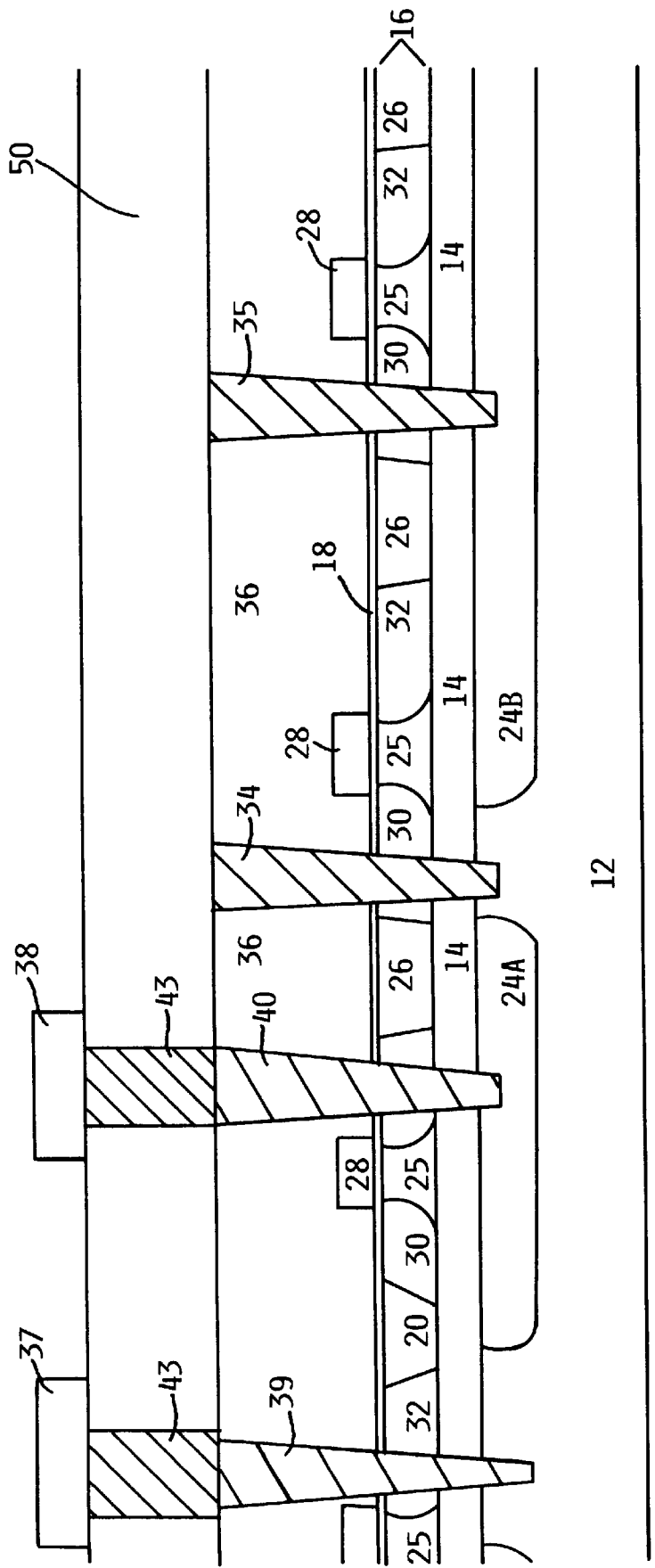

Metallization may then be formed and patterned to provide source 37 and ground 38 contacts, FIG. 6.

In a further embodiment of the invention, conductive studs 34 and 35 may contact with transistor 25A and/or 25B to provide thermal conduction to the substrate and a discharge path to the power planes for thermal energy and carriers.

The method of the invention patterns the substrate 12 so that discrete functions can be electrically isolated from each other and from the power and ground signals. The selective buried implant regions 24A and 24B may distribute signals, e.g., voltage switching nets, that are required either in geographically distributed areas within the chip or globally across the surface of the chip. A net is defined as a common point electrically with other electrical features in the circuit where the switching and the voltage are common. Examples of distributed signals which can be buried include: functional unit powerdown signals for power saving and other applications; power good signals indicating functional start-up is permissible; reset functions; cache invalid signals; interrupts, etc. In fact, any functions having DC or pseudo DC signals, traditionally distributed via metal wiring, can take advantage of the invention and be moved into the buried semiconductor layer. A clock grid or tree also may be patterned into the substrate 12 and used to keep the FET devices synchronized by metal studs 34 and 35 which interconnect the grid to the surface. This latter application, however, may not be practicable because of excessive undesirable capacitance. These signals paths are selectively defined/isolated from the power and ground distribution in the buried planes by the selective implantation of the invention. Note that in the preferred embodiment the power plane is continuous under the signal net but the ground plane is selectively replaced by the signal net "wire."

Figure 7:
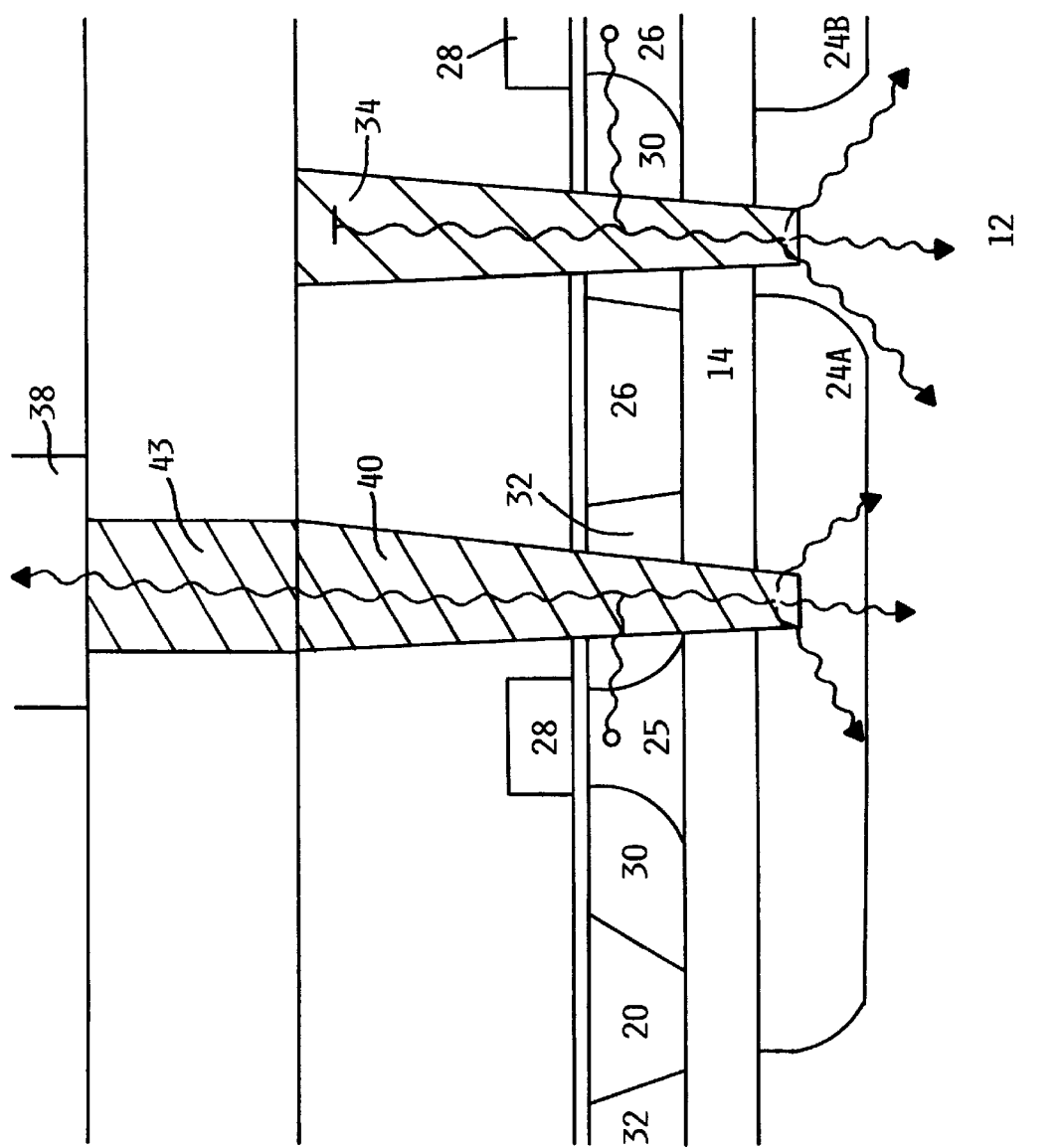
FIG. 7 illustrates how the invention herein dissipates thermal energy.

One significant limitation of SOI has traditionally been that heat generated within switched transistors is not removed at a satisfactory rate because of the thermal insulative properties of the electrically insulating film(s) placed on all sides of the transistors. When conventional transistors switch frequently, more joule energy is generated and, as a result, the response time of the transistors significantly decreases which affects performance of the circuit. Circumstances, however, often require two or more transistors to match in terms of their response time. One or more transistors, because they actually have a higher switching frequency because, for instance, the data may contain more logical ones than zeroes, generates more heat and responds more slowly. This invention, therefore, mitigates the thermal effects of rapid transistor switching. The invention can also mitigate the thermal effects of the active devices such as resistors and self-heating capacitors by providing a thermal path as shown in FIG. 7. The incorporation of the buried electrical and thermal conductive studs enhances heat dissipation similar to that of bulk semiconductor materials. Indeed, the invention can be specifically implemented for its thermal conductive capabilities.

Figure 8:
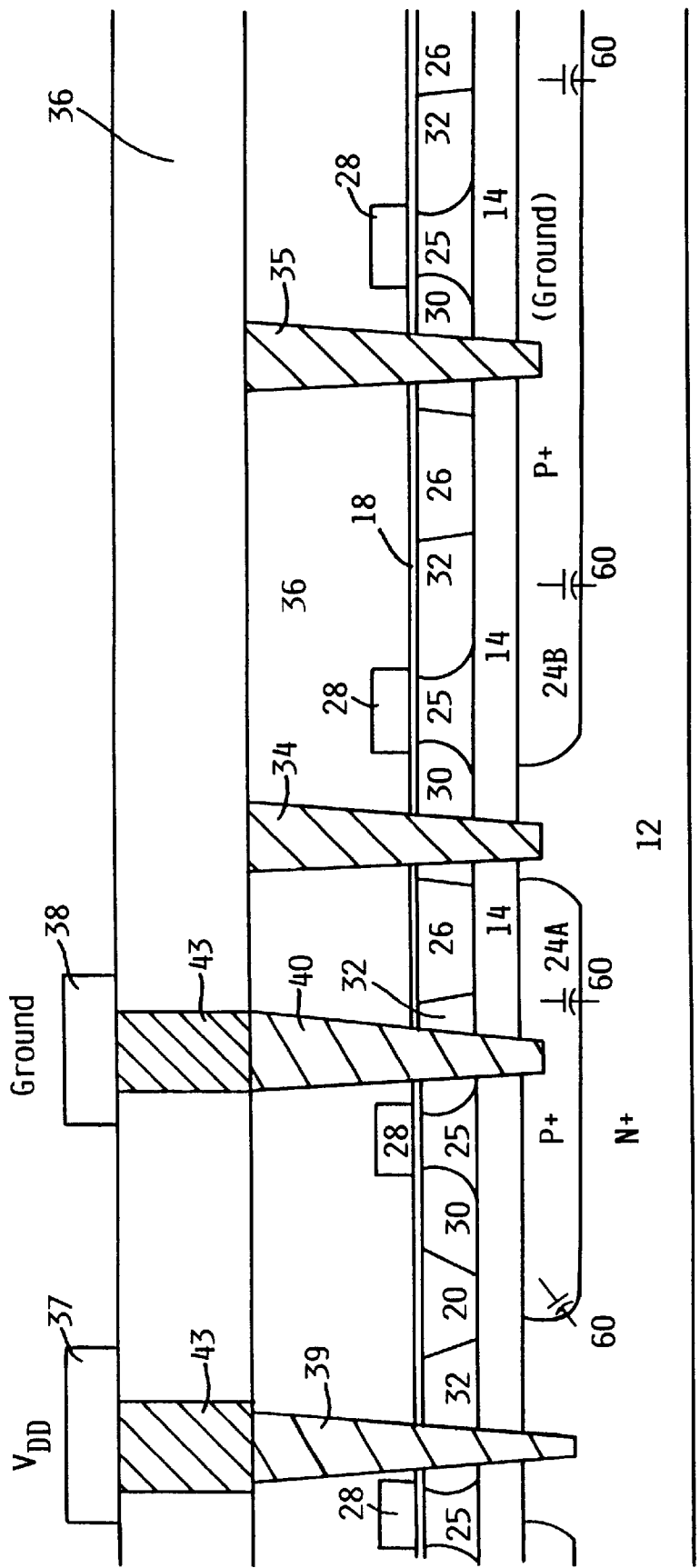
FIG. 8 illustrates the decoupling capacitance capability of the invention.

Further as semiconductors are operated at continually higher operating frequencies, the amount of wiring associated with power/ground distribution is ever increasing. Significant transient current spikes associated with high frequency operation typically requires that relatively significant amounts of capacitance, typically tens of nanofarads, to the chip and/or package to minimize power supply voltage collapse. This invention, in one preferred embodiment, adds several nanofarads of capacitance per square millimeter of chip area. Shown in FIG. 8 are several representations 60 of the decoupling capacitive aspect of the invention which actually extends along the boundary of the volumes 24A, 24B and the volume of the substrate 12. The quality of the capacitance is defined by the abruptness of the junction between volumes 24A, 24B and substrate volume 12 and the magnitude of the difference in the concentration of the acceptor/donor carriers in each layer. The larger the difference in magnitude of the concentration, the better the capacitance. The crisp decoupling capacitance provided by the invention maintains the voltage levels more at their appropriate levels and keeps them from becoming "mixed" so that the voltage of a logical zero, for example, is maintained nearer ground than without the invention. Similarly, the voltage level of a logical one will be held more at $V_{dd}$. Buried patterned layers provide more than sufficient decoupling capacitance between the voltage supply rails for ground and power $V_{dd}$, without adding additional gate oxide which is expensive and requires a lot of area and/or without adding external added capacitance.

While the invention has been particularly shown and described with reference to the preferred embodiment thereof, it will be understood by those of skill in the art that the foregoing may be easily changed both in form and detail without departing from the spirit and scope of the invention; the invention resides in the claims hereinafter appended.

What is claimed:

1. A semiconductor circuit comprising:
   (a) an active layer doped with impurities to form a plurality of devices;
   (b) a conductive substrate having a first volume doped with a first dopant and a second volume doped with a second dopant, said first volume for providing power at a power voltage level to at least some of said plurality of devices in said active layer, said second volume for providing a ground for at least some of said plurality of devices in said active layer;
   (c) an insulator layer disposed between said active layer and said conductive substrate;
   (d) a plurality of first conductors electrically connecting at least some of said plurality of devices to said first volume, said plurality of first conductors providing power to at least some of said plurality of devices from said first volume; and
   (e) a plurality of second conductors electrically connecting at least some of said plurality of devices to said second volume, said plurality of second conductors providing a ground for at least some of said plurality of devices.

2. The circuit of claim 1, wherein a first device of said plurality of devices is a first transistor and a conductor of said plurality of first conductors is a first stud in electrical contact with the first transistor.

3. The circuit of claim 1, wherein a second device of said plurality of devices is a second transistor and a conductor of said plurality of second conductors is a second stud in electrical contact with the second transistor.

4. The circuit of claim 1, wherein the substrate comprises doped silicon.

5. The circuit of claim 1, wherein the insulator layer comprises an oxide of silicon.

6. The device of claim 1, wherein the active layer comprises silicon.

7. The device of claim 1, wherein the active layer comprises a semiconductor material selected from the group consisting of Group III, IV, and V, and mixtures thereof.

8. The circuit of claim 1, additionally comprising a dielectric layer formed over the plurality of devices.

9. The circuit of claim 8, wherein the dielectric layer leaves a portion of the first and second conductors exposed.

10. The circuit of claim 1, wherein the dopants in the active layer do not contact the insulator layer.

11. The circuit of claim 1, wherein the first volume is doped with an n+ type dopant, and a first device of said plurality of devices is a first transistor comprising a p+ diffusion, and a conductor of said plurality of first conductors electrically connects the first volume and the first transistor p+ diffusion.

12. The circuit of claim 1, wherein the second volume is doped with a p+ type dopant, and a second device of said plurality of devices is a second transistor comprising a n+ diffusion, and a conductor of said plurality of second conductors electrically connects the second volume and the second transistor n+ diffusion.

13. A silicon-on-insulator semiconductor circuit comprising:
   (a) a silicon layer doped with impurities forming a plurality of transistors;
   (b) a conductive silicon substrate having a first volume doped with an n+ dopant at a power voltage level, and a second volume doped with a p+ dopant at a ground voltage level, said first volume for providing power at a power voltage level to at least some of said plurality of transistors in said silicon layer, said second volume for providing a ground for at least some of said plurality of transistors in said silicon layer;
   (c) an insulator layer of silicon dioxide disposed between said silicon layer and said conductive substrate;
   (d) an isolation volume between a first transistor and a second transistor of said plurality of transistors;
   (e) a first conductive stud electrically connecting the first transistor to the first volume, said first conductive stud providing power to said first transistor; and
   (f) a second conductive stud electrically connecting the second transistor and the second volume, said second conductive stud providing a ground for said second transistor.

14. The circuit of claim 13, wherein the first conductive stud and the second conductive stud are made of material selected from the group consisting of tungsten, copper, aluminum, and doped silicon.

15. The circuit of claim 13, additionally comprising a dielectric layer over the first and second transistors.

16. The circuit of claim 15, wherein the dielectric layer leaves a portion of the first and second conductive studs exposed.

17. The circuit of claim 13, wherein the impurities in the silicon layer do not contact the insulator layer.

\* \* \* \* \*